(12) United States Patent
Xu et al.

(10) Patent No.: US 12,302,559 B2
(45) Date of Patent: May 13, 2025

(54) THREE-DIMENSIONAL MEMORY AND METHOD FOR MANUFACTURING THE SAME

(71) Applicant: YANGTZE MEMORY TECHNOLOGIES CO., LTD., Wuhan (CN)

(72) Inventors: Zongke Xu, Wuhan (CN); Bin Yuan, Wuhan (CN); Qiangwei Zhang, Wuhan (CN); Bo Xu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 389 days.

(21) Appl. No.: 17/582,871

(22) Filed: Jan. 24, 2022

(65) Prior Publication Data

US 2022/0165745 A1 May 26, 2022

Related U.S. Application Data

(63) Continuation of application No. PCT/CN2021/012116, filed on Sep. 28, 2021.

(30) Foreign Application Priority Data

Nov. 25, 2020 (CN) .......................... 202011338956.4

(51) Int. Cl.
*H10B 43/10* (2023.01)
*H10B 43/27* (2023.01)

(52) U.S. Cl.
CPC .............. *H10B 43/10* (2023.02); *H10B 43/27* (2023.02)

(58) Field of Classification Search
None
See application file for complete search history.

(56) References Cited

U.S. PATENT DOCUMENTS

| 7,911,850 B2 | 3/2011 | Chae et al. |
| 9,728,265 B2 | 8/2017 | Lee |

(Continued)

FOREIGN PATENT DOCUMENTS

| CN | 109346471 A | 2/2019 |
| CN | 110767657 A | 2/2020 |

(Continued)

OTHER PUBLICATIONS

International Search Report issued in corresponding International Application No. PCT/CN2021/121162, mailed Nov. 25, 2020, 4 pages.

*Primary Examiner* — Jack S Chen
(74) *Attorney, Agent, or Firm* — BAYES PLLC

(57) ABSTRACT

The present disclosure relates to a three-dimensional memory and a method for manufacturing the same. The three-dimensional memory includes a gate stack structure including a core area and a step area which are disposed in juxtaposition and in direct contact in a first direction; a dummy separation structure penetrating through the step area in the first direction; and a gate separation structure penetrating through the core area in the first direction, the gate separation structure having a first end in contact with the dummy separation structure in the first direction, the dummy separation structure having a second end in contact with the gate separation structure in the first direction, and the first end being located within the second end.

20 Claims, 4 Drawing Sheets

(56) References Cited

U.S. PATENT DOCUMENTS

2019/0287982 A1    9/2019  Hinoue et al.
2022/0165745 A1*   5/2022  Xu .......................... H10B 43/27

FOREIGN PATENT DOCUMENTS

| CN | 111403398 A | 7/2020 |
| CN | 111668228 A | 9/2020 |
| CN | 112185967 A | 1/2021 |
| CN | 112331667 A | 2/2021 |
| CN | 112466884 A | 3/2021 |
| CN | 114080685 A | 2/2022 |

* cited by examiner

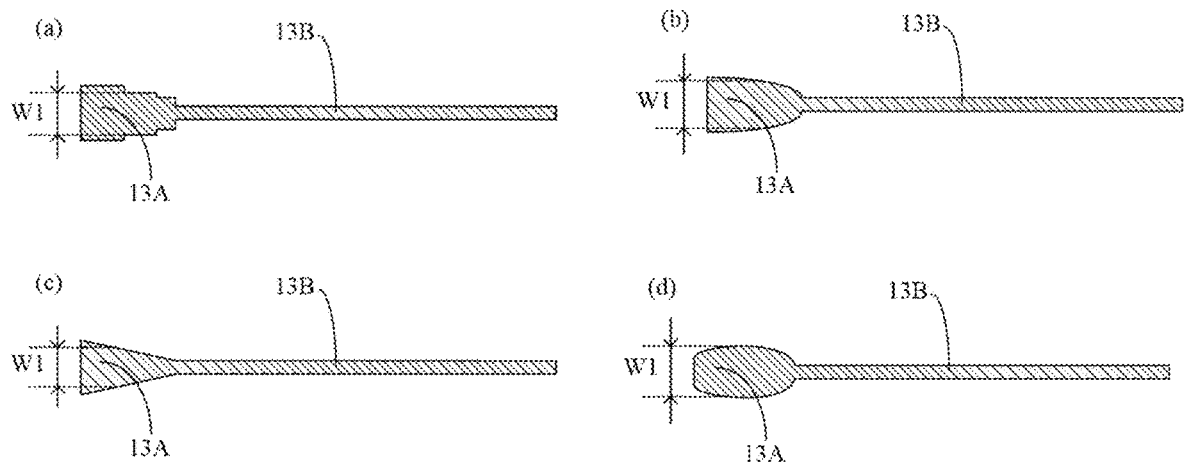

FIG. 6

| Forming a gate stack structure comprising a core area and a step area which are disposed in juxtaposition and in direct contact in a first direction | — S11 |

| Forming a dummy isolation structure and a gate isolation structure, the dummy isolation structure penetrating through the step area in the first direction, the gate isolation structure penetrating through the core area in the first direction, the gate isolation structure having a first end in contact with the dummy isolation structure in the first direction, the dummy isolation structure has a second end in contact with the gate isolation structure in the first direction, and the first end being located within the second end | — S12 |

FIG. 7

THREE-DIMENSIONAL MEMORY AND METHOD FOR MANUFACTURING THE SAME

CROSS-REFERENCE TO RELATED APPLICATIONS

This application is a continuation of International Application No. PCT/CN2021/121162, filed on Sep. 28, 2021, which claims the benefit of priority to C.N. Application No. 202011338956.4, filed on Nov. 25, 2020, both of which are hereby incorporated by reference in their entireties.

BACKGROUND

The present disclosure relates to a three-dimensional memory and a method for manufacturing the same.

With the technical development, the semiconductor industry continues to seek a new mode of production to allow each memory die in a memory device to have more memory cells. A 3D NAND (three-dimensional NAND) memory has become a relatively cutting-edge and very promising three-dimensional memory technology currently due to its advantages of high storage density, low cost, etc.

SUMMARY

Embodiments of the present disclosure provide a three-dimensional memory which comprises: a gate stack structure comprising a core area and a step area which are disposed in juxtaposition and in direct contact in a first direction; a dummy separation structure penetrating through the step area in the first direction; and a gate separation structure penetrating through the core area in the first direction, the gate separation structure having a first end in contact with the dummy separation structure in the first direction, the dummy separation structure having a second end in contact with the gate separation structure in the first direction, and the first end being located within the second end.

For example, the second end comprises two holding sub-parts, the first end is located between the two holding sub-parts in a second direction perpendicular to the first direction and is in direct contact with the two holding sub-parts.

For example, widths of the holding sub-parts in the second direction perpendicular to the first direction gradually increase from the step area towards the core area in the first direction.

For example, the second end further comprises a connection sub-part which is connected with the two holding sub-parts.

For example, the connection sub-part is in direct contact with the first end.

For example, the dummy separation structure further comprises a second extending part which is disposed in juxtaposition to and in direct contact with the second end.

For example, the second extending part extends in the first direction.

For example, a width of the second end in the second direction perpendicular to the first direction is greater than a width of the second extending part in the second direction.

For example, the width of the second end in the second direction gradually increases from the step area towards the core area in the first direction.

For example, the width of the second end in the second direction first gradually increases and then gradually decreases from the step area towards the core area in the first direction.

For example, a material of the dummy separation structure is an insulation material.

For example, the gate separation structure further comprises a first extending part which is disposed in juxtaposition to and in direct contact with the first end, and the first end is surrounded by the first extending part and the second end together on the circumference.

For example, the first extending part extends in the first direction.

For example, a width of at least part of the first end in the second direction perpendicular to the first direction is greater than a width of the first extending part in the second direction.

For example, the width of the first end in the second direction gradually increases from the core area towards the step area in the first direction.

For example, the width of the first end in the second direction first gradually increases and then gradually decreases from the core area towards the step area in the first direction.

For example, the first end extends into the step area in the first direction.

For example, a maximum width of the first end in the second direction perpendicular to the first direction is not greater than a minimum width of the second end in the second direction.

For example, the gate separation structure comprises a conductive structure and an electric insulation layer located between the conductive structure and the gate stack structure in the second direction perpendicular to the first direction.

For example, the second end comprises two holding sub-parts, the first end is located between the two holding sub-parts in the second direction perpendicular to the first direction and is in direct contact with the two holding sub-parts, the three-dimensional memory further comprises: a plurality of channel structures which are located in the core area and penetrate through the core area in a third direction intersected with the first direction and the second direction; a plurality of dummy channel structures which are located in the step area and penetrate through the step area in the third direction.

For example, the dummy separation structure and the gate separation structure penetrate through the gate stack structure in the third direction.

For example, the three-dimensional memory further comprises a substrate on which the gate stack structure is located, the third direction is perpendicular to the first direction and the second direction.

For example, the dummy separation structure is used to divide the step area into a plurality of block step areas in the second direction perpendicular to the first direction, the gate separation structure is used to divide the core area into a plurality of block core areas in the second direction.

Embodiments of the present disclosure further provide a manufacturing method of a three-dimensional memory, which comprises: forming a gate stack structure comprising a core area and a step area which are disposed in juxtaposition and in direct contact in a first direction; forming a dummy separation structure and a gate separation structure, the dummy separation structure penetrating through the step area in the first direction, the gate separation structure penetrating through the core area in the first direction, the gate separation structure having a first end in contact with the dummy separation structure in the first direction, the dummy separation structure having a second end in contact with the gate separation structure in the first direction, and the first end being located within the second end.

For example, forming the dummy separation structure and the gate separation structure comprises: forming a dummy gate isolation trench in the step area, the dummy gate isolation trench penetrating through the step area in the first direction; filling an insulation material in the dummy gate isolation trench to form the dummy separation structure; forming a gate isolation trench in the core area and the second end of the dummy separation structure, the gate isolation trench penetrating through the core area and part of the second end in the first direction; forming the gate separation structure in the gate isolation trench.

BRIEF DESCRIPTION OF THE DRAWINGS

The drawings to be used in the description of embodiments are briefly described as follows for the purpose of illustrating the technical solutions in the embodiments of the present disclosure more clearly. Apparently, the drawings described below are only some embodiments of the present disclosure. Those skilled in the art may obtain other drawings according to such drawings without creative work.

FIG. 6 is a structural view of four dummy separation structures provided by embodiments of the present disclosure.

FIG. 7 is a flow chart of a manufacturing method of a three-dimensional memory provided by embodiments of the present disclosure.

DETAILED DESCRIPTION

Figure 1:
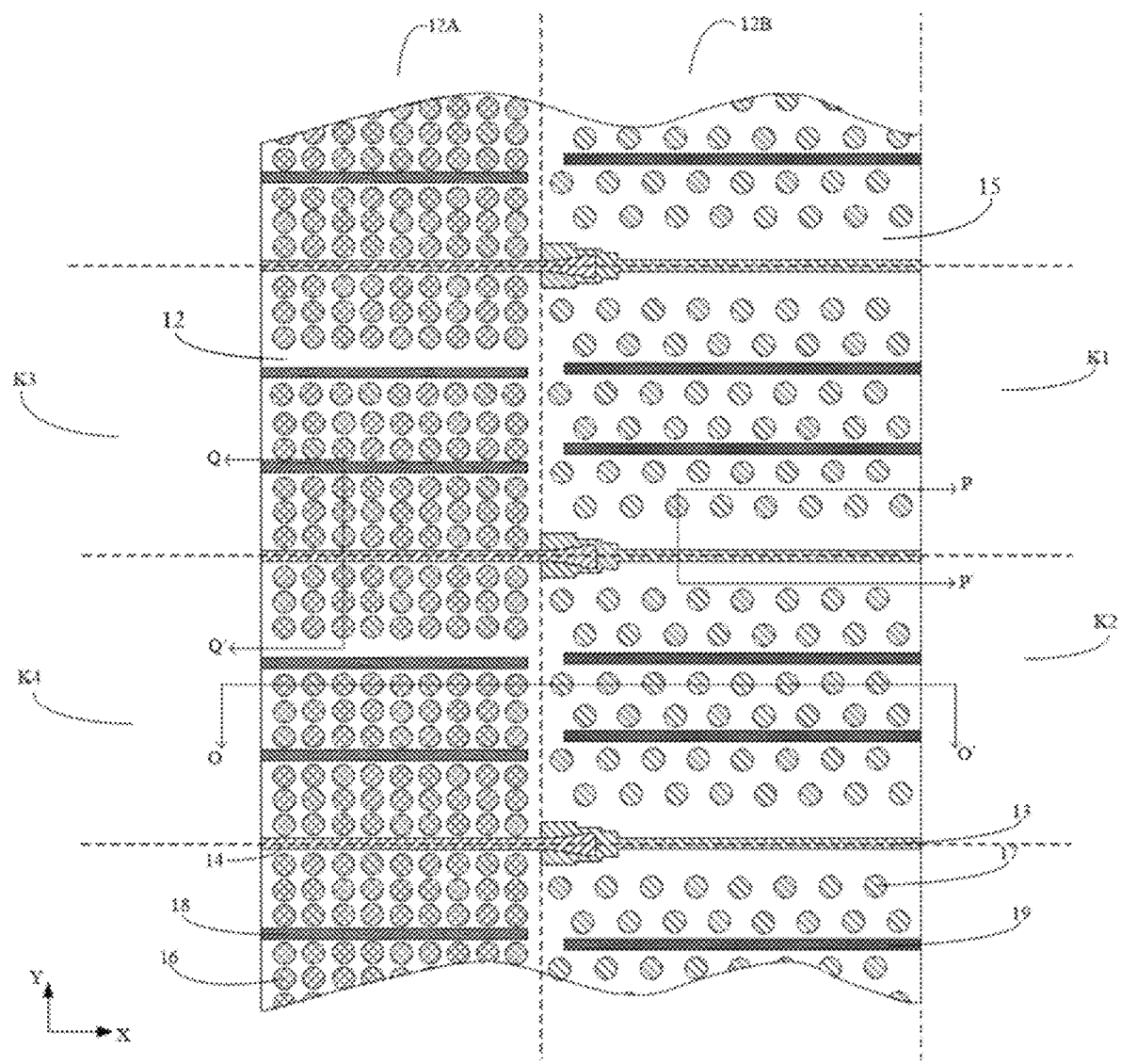
FIG. 1 is a structural top view of a three-dimensional memory provided by embodiments of the present disclosure.

The present disclosure will be further described in detail in conjunction with the accompanying drawings and embodiments. It is specially pointed out that, embodiments below are merely used to illustrate the present disclosure, rather than to restrict the scope of the present disclosure. Similarly, the embodiments below are merely part but not all of embodiments of the present disclosure. All other embodiments obtained by those of ordinary skill in the art without creative work shall fall in the protection scope of the present disclosure.

Furthermore, the direction phraseologies as mentioned in the present disclosure, e.g., [upper], [lower], [front], [back], [left], [right], [inside], [outside], [side], etc., are merely intended to describe the directions with reference to the accompanying drawings. Thus, the direction phraseologies are used for illustration and understanding of the present disclosure, instead of restriction of the present disclosure. In respective drawings, elements with similar structures are denoted by the same reference sign. For the sake of clarity, respective portions in the drawings are not drawn to scale. In addition, some well-known portions may not be shown in the drawings.

A 3D NAND memory typically comprises one or more planes. A step area for leading out a gate is typically disposed on at least one side of the planes. The step area has a staircase shape. The plane and the step area are typically divided into a plurality of blocks to form a plurality of block memory areas.

However, in the existing 3D NAND memory, a gate line isolation trench (or called as a gate separation structure) is used to separate the blocks. Due to a stress effect of the step area, the gate line isolation trench located in the step area is susceptible to deformation or even rupture, thereby affecting the performance of the 3D NAND memory.

For example, a dummy separation structure and a gate separation structure are used to separate a step area and a core area of a gate stack structure respectively, the gate separation structure has a first end in contact with the dummy separation structure in a first direction, the dummy separation structure has a second end in contact with the gate separation structure in the first direction, and the first end is located within the second end, so that it may cope with the issue that the gate separation structure is susceptible to deformation or even rupture at the step area due to the stress effect of the step area when the gate separation structure is used to separate the step area, thereby improving the performance of the three-dimensional memory.

Figure 2:
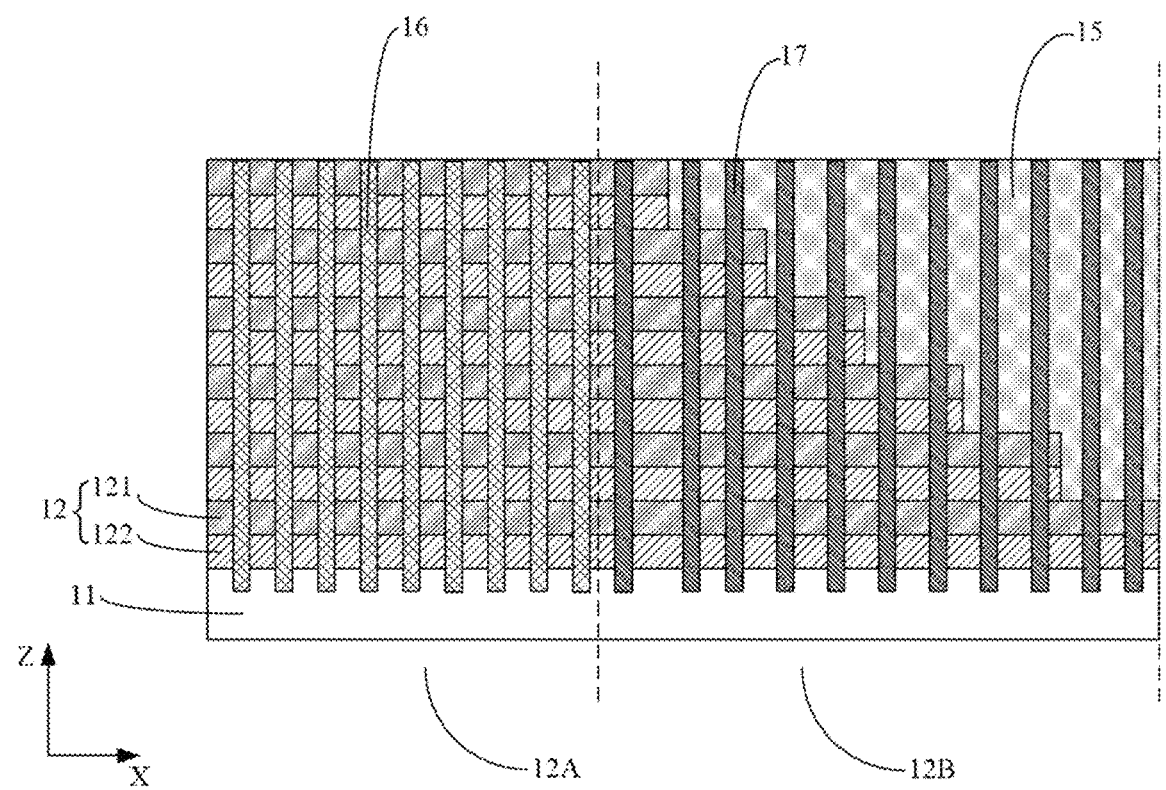
FIG. 2 is a structural view of a cross section taken along a line O-O' in FIG. 1.
Figure 3:
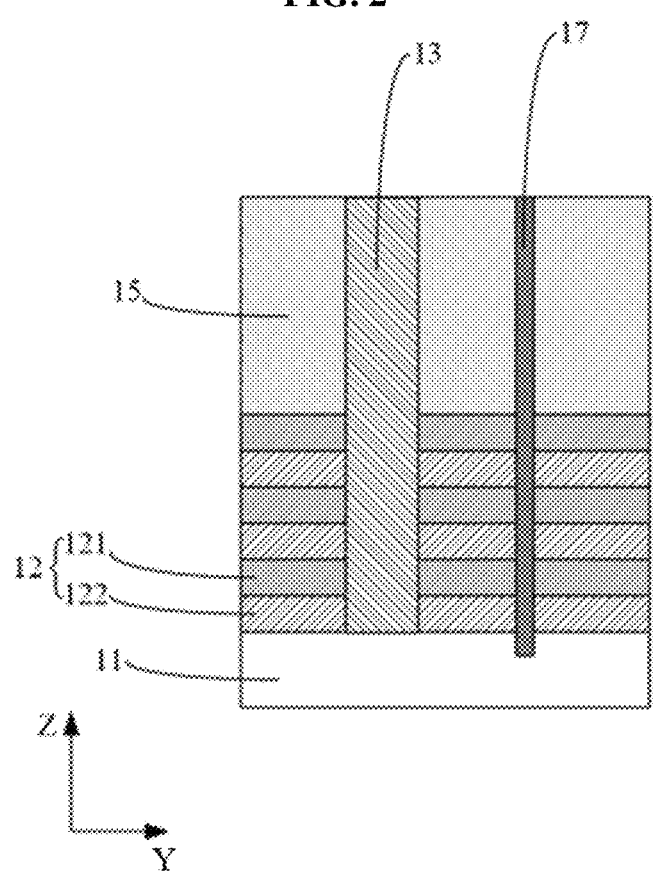
FIG. 3 is a structural view of a cross section taken along a line P-P' in FIG. 1.
Figure 4:
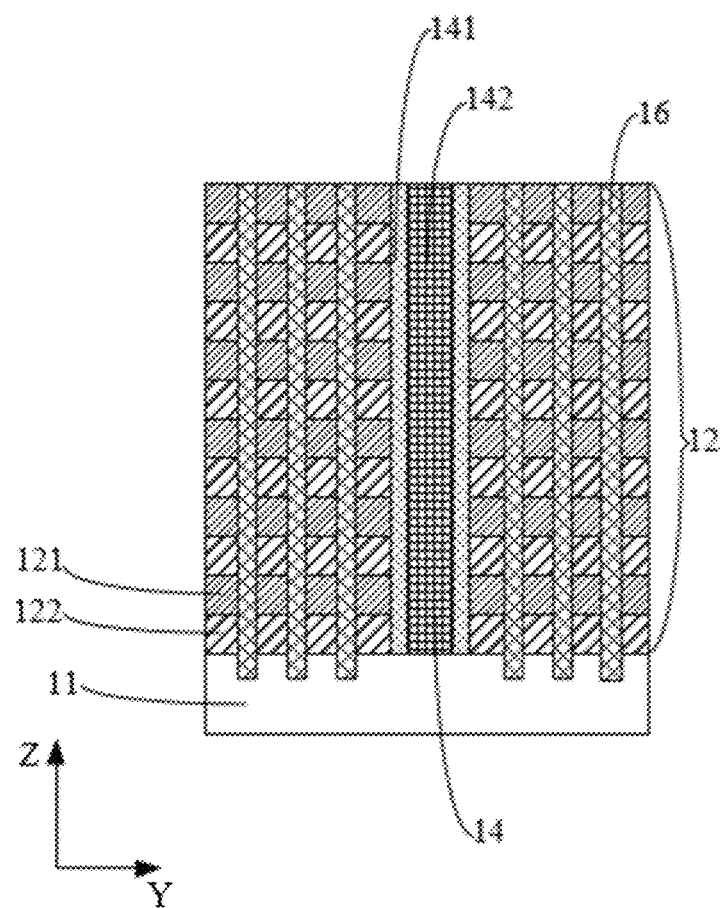
FIG. 4 is a structural view of a cross section taken along a line Q-Q' in FIG. 1.

Referring to FIGS. 1-4, FIG. 1 is a structural top view of a three-dimensional memory provided by embodiments of the present disclosure, FIG. 2 is a structural view of a cross section taken along a line O-O' in FIG. 1, FIG. 3 is a structural view of a cross section taken along a line P-P' in FIG. 1, and FIG. 4 is a structural view of a cross section taken along a line Q-Q' in FIG. 1. The three-dimensional memory comprises a gate stack structure 12, a dummy separation structure 13 and a gate separation structure 14. For example, the gate stack structure 12 comprises a core area 12A and a step area 12B which are disposed in juxtaposition and in direct contact in a first direction X. The dummy separation structure 13 penetrates through the step area 12B in the first direction X. The gate separation structure 14 penetrates through the core area 12A in the first direction X.

Figure 5:
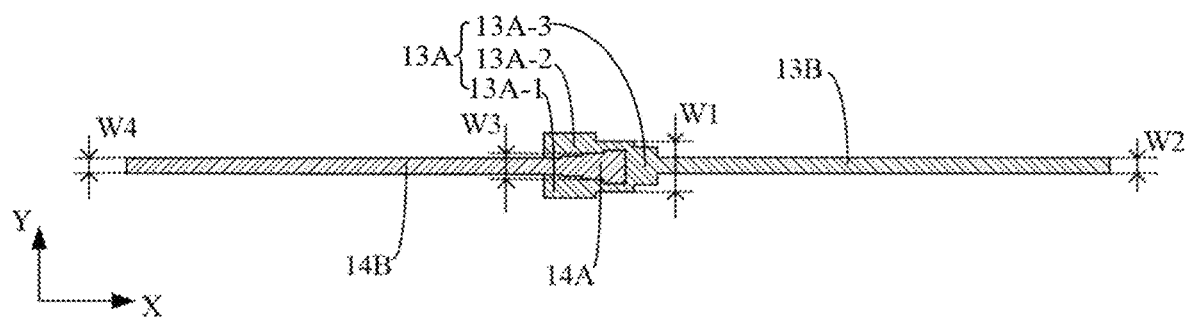
FIG. 5 is a structural view of a gate separation structure and a dummy separation structure after connection provided by embodiments of the present disclosure.

In some embodiments of the present disclosure, as shown in FIG. 5, the gate separation structure 14 has a first end 14A in contact with the dummy separation structure 13 in the first direction X, the dummy separation structure 13 has a second end 13A in contact with the gate separation structure 14 in the first direction X, and the first end 14A is located within the second end 13A to ensure that the dummy separation structure 13 and the gate separation structure 14 can have a good isolation effect after being connected together. Moreover, as compared with a solution of separating the step area using the gate separation structure in the related art, some embodiments of the present disclosure separate the step area 12B using the dummy separation structure 13 which can not only support the step area 12B of the gate stack structure 12 to enable the step area 12B to be less liable to collapse, and but also separate the first end 14A of the gate separation structure 14 extending into the step area 12B from the gate separation structure 12 to enable the first end 14A to be surrounded by a same film layer (i.e., the dummy separation structure 13) from the bottom up, thereby avoiding the issue of electric leakage caused by deformation of the gate separation structure 14 due to different film layer stresses subjected from the bottom up.

For example, as shown in FIG. 2, the gate stack structure 12 may comprise a plurality of gate layers 121 and gate insulation layers 122 which are disposed in an alternate stack-up manner in a longitudinal direction Z perpendicular to the first direction X. As shown in FIG. 1, the dummy separation structure 13 can be used to divide the step area 12B of the gate stack structure 12 into a plurality of block step areas K1/K2 in a second direction Y perpendicular to the first direction X, and the gate separation structure 14 can be used to divide the core area 12A of the gate stack structure 12 into a plurality of block core areas K3/K4 in the second direction Y.

For example, as shown in FIG. 2, in the gate stack structure 12, the gate layers 121 are located between two adjacent gate insulation layers 122. The material of the gate layers 121 may be a conductive material, e.g., tungsten, cobalt, copper, aluminum, etc. The material of the gate insulation layers 122 may be any one of silicon oxide, silicon nitride, silicon oxynitride and silicon carbonitride. Moreover, the number of the gate layers 121 may depend on the number of memory cells to be formed in the longitudinal direction Z. The dummy separation structure 13 may specifically be an insulation layer, and the material thereof may be any one of insulation materials such as silicon oxide, silicon nitride, silicon oxynitride and silicon carbonitride, etc. As shown in FIG. 4, the gate separation structure 14 may specifically comprise a conductive structure 142 and an electric insulation layer 141 located between the conductive structure 142 and the gate stack structure 12 in the second direction Y perpendicular to the first direction X. For example, the conductive structure 142 may comprise a conductive material such as titanium or titanium nitride, polysilicon, and/or metal tungsten, etc. The electric insulation layer 141 is used for electrical isolation of the conductive structure 142 from the gate stack structure 12, and specifically may be an oxide layer. Moreover, the conductive structure 142 may serve as a common source to provide a conductive channel for source connection in the three-dimensional memory.

In a specific embodiment, as shown in FIGS. 1 and 5, the second end 13A may comprise two holding sub-parts 13A-1/13A-2 (i.e., a first holding sub-part 13A-1 and a second holding sub-part 13A-2), the first end 14A may be located between the two holding sub-parts 13A-1/13A-2 in the second direction Y perpendicular to the first direction X, and is in direct contact with the two holding sub-parts 13A-1/13A-2 to ensure that the second end 13A of the dummy separation structure 13 can separate the first end 14A of the gate separation structure 14 from the gate stack structure 12 located on both sides of the first end 14A in the second direction Y.

For example, as shown in FIGS. 1 and 5, widths of the first holding sub-part 13A-1 and the second holding sub-part 13A-2 perpendicular to the second direction Y may gradually increase from the step area 12B to the core area 12A in the first direction X to increase a process window when forming the gate separation structure 14 so as to reduce the fabrication process difficulty of the three-dimensional memory.

In some embodiments, as shown in FIG. 5, the second end 13A may further comprise a connection sub-part 13A-3 which is connected with the first holding sub-part 13A-1 and the second holding sub-part 13A-2. For example, the connection sub-part 13A-3 may be in direct contact with the first end 14A.

In a specific embodiment, as shown in FIG. 5, the dummy separation structure 13 may further comprise a second extending part 13B which is disposed in juxtaposition to and in direct contact with the second end 13A. The second extending part 13B may extend in the first direction X.

Moreover, a width W1 of the second end 13A in the second direction Y perpendicular to the first direction X is greater than a width W2 of the second extending part 13B in the second direction Y. Accordingly, only by increasing the width of part of the dummy separation structure 13, the manufacturing deviation tolerance of the dummy separation structure 13 and the gate separation structure 14 may be increased, thereby facilitating reducing the process difficulty.

Moreover, during specific implementation, as shown in FIGS. 1 and 5, the width W2 of the second extending part 13B in the second direction Y may be a fixed value V1, while the width W1 of the second end 13A in the second direction Y may gradually increase from the step area 12B to the core area 12A in the first direction X. For example, as shown in FIG. 6 (a) and (b), the width W1 of the second end 13A in the second direction Y may gradually increase from the middle to two sides by a non-linear gradual increase rule (e.g., a broken line or an arc), or may gradually increase from the middle to two sides by a linear gradual increase rule (e.g., a straight line), as shown in FIG. 6 (c). In some alternative embodiments, as shown in FIGS. 1, 5 and 6(d), the width W1 of the second end 13A in the second direction Y may also first gradually increase and then gradually decrease from the step area 12B to the core area 12A in the first direction X, and the minimum width of the second end 13A in the second direction Y is not less than the fixed value V1. Accordingly, by designing the second end 13A of the dummy separation structure 13 as a large end structure, the dummy separation structure 13 and the gate separation structure 14 can be ensured to have a good isolation effect after being connected together to avoid the issue of electric leakage between two adjacent block memory areas.

It should be noted that, FIG. 6 is a structural view of the dummy separation structure 13 of which the second end 13A does not surround the first end 14A of the gate separation structure 14 provided by some embodiments of the present disclosure. That is, the dummy separation structure 13 as shown in FIG. 6 is a dummy separation structure 13 in an intermediate structure obtained after formation of the dummy separation structure 13 and before formation of the gate separation structure 14 during the fabrication course of the three-dimensional memory.

In the above embodiments, as shown in FIG. 5, the gate separation structure 14 may further comprise a first extending part 14B which is disposed in juxtaposition to and in direct contact with the first end 14A, and the first end 14A is surrounded by the first extending part 14B and the second end 13A of the dummy separation structure 13 together on the circumference. For example, the second extending part 13B may extend in the first direction X. Moreover, a width W3 of at least part of the first end 14A in the second direction Y perpendicular to the first direction X is greater than a width W4 of the first extending part 14B in the second direction Y. Accordingly, only by increasing the width of part of the gate separation structure 14, the manufacturing deviation tolerance of forming the dummy separation structure 13 and the gate separation structure 14 may be further increased, thereby facilitating further reducing the process difficulty.

During specific implementation, as shown in FIGS. 1 and 5, the width W4 of the first extending part 14B in the second direction Y may also be a fixed value V2 which may be less than the fixed value V1, that is, the width W4 of the first extending part 14B in the second direction Y is less than the width W2 of the second extending part 13B in the second direction Y. Further, the width W3 of the first end 14A in the second direction Y may gradually increase from the core area 12A to the step area 12B in the first direction X. Moreover, similar to the specific embodiment in which the width W3 of the second end 13A in the second direction Y gradually increases, the width W3 of the first end 14A in the second direction Y may also gradually increase from the middle to two sides by a non-linear gradual increase rule (e.g., a broken line or an arc) or by a linear gradual increase rule (e.g., a straight line), or may also first gradually increase and then gradually decrease from the core area 12A to the step area 12B in the first direction X. Meanwhile, the minimum width of the first end 14A in the second direction Y may also not be less than the fixed value V2.

Accordingly, by designing the first end 14A of the gate separation structure 14 as a large end structure, it may further ensure that the dummy separation structure 13 and the gate separation structure 14 can have a good isolation effect after being connected together to better avoid the issue of electric leakage between two adjacent block memory areas.

Moreover, to enable the first end 14A to be better wrapped by the second end 13A, a width variation rule of the second end 13A in the second direction Y may match with that of the first end 14A in the second direction Y; for example, the widths W1/W3 of the second end 13A and the first end 14A in the second direction Y may both gradually increase from the middle to two sides by a non-linear gradual increase rule (e.g., a broken line). In some specific embodiments, the maximum width of the first end 14A in the second direction Y may also be designed to be not greater than the minimum width of the second end 13A in the second direction Y, such that the first end 14A may be wrapped by the second end 13A more easily.

It should be noted that, in some embodiments of the present disclosure, only side end widths of the dummy separation structure 13 and/or the gate separation structure 14 are increased, such that main body widths of the dummy separation structure 13 and the gate separation structure 14 still maintain at a smaller value, which can lower the process requirements of an etching step and a filling step as compared with a solution of increasing the overall widths of the separation structures.

Moreover, only one core area 12A and one step area 12B are given as an example in some embodiments of the present disclosure. In some embodiments, the number of the step areas 12B may be two, and the core area 12A is located between the two step areas 12B. In some other embodiments, the number of the core areas 12A may be two, and the step area 12B is located between the two core areas 12A. Accordingly, an internal structure on one side of the three-dimensional memory in the first direction X can be referred to an internal structure on the other side. It can be appreciated that, some embodiments of the present disclosure only specifically set forth the internal structure on one side of the three-dimensional memory in the first direction X.

In the above embodiments, as shown in FIGS. 1 and 5, the first end 14A of the gate separation structure 14 may extend into the step area 12B of the gate stack structure 12 in the first direction X. Consequently, the dummy separation structure 13 can surround the first end 14A of the gate separation structure 14 in three directions without extending into the core area 12A of the gate stack structure 12, thereby avoiding affecting the performance of the three-dimensional memory due to the fact that the dummy separation structure 13 extends into the core area 12A of the gate stack structure 12.

In the above embodiments, as shown in FIGS. 1-4, the three-dimensional memory may further comprise a plurality of channel structures 16 and a plurality of dummy channel structures 17. For example, the plurality of channel structures 16 are located in the core area 12A, and can penetrate through the core area 12A in a third direction (e.g., the longitudinal direction Z) intersected with the first direction X and the second direction Y. The plurality of dummy channel structures 17 are located in the step area 12B, and can penetrate through the step area 12B in the third direction. For example, the channel structures 16 may specifically comprise dielectric cylinders, channel layers surrounding the dielectric cylinders, and charge storage layers surrounding the channel layers. The charge storage layers may comprise tunneling oxidation layers surrounding the channel layers, charge trapping layers surrounding the tunneling oxidation layers, and blocking oxidation layers surrounding the charge trapping layers. For example, the material of the charge trapping layers may be silicon nitride, the material of the channel layers may be polysilicon. The dummy separation structure 13 and the gate separation structure 14 may penetrate through the gate stack structure 12 in the third direction.

Moreover, it can be appreciated that, for the three-dimensional memory, one channel structure 16 in the core area 12A is shared by a plurality of memory cells in one memory string. The plurality of dummy channel structures in the step area 12B do not provide a storage function, but are used to provide mechanical support to avoid collapse of a memory device. Moreover, during specific implementation, the dummy channel structures and the channel structures may have the same structure. Therefore, it is not described redundantly here.

For example, as shown in FIGS. 1-4, the three-dimensional memory may further comprise a semiconductor layer which may for example be a substrate 11. The gate stack structure 12 is located on the semiconductor layer (e.g., the substrate 11), whose material may for example be monocrystalline silicon, monocrystalline germanium, or silicon on insulator (SOI), etc. In some examples, the semiconductor layer may comprise polysilicon. For example, the material of the semiconductor layer may be polysilicon or other suitable materials. For example, for ease of description, the semiconductor layer is described as a substrate subsequently. For example, the gate stack structure 12 may be formed after formation of the semiconductor layer. For another example, the gate stack structure 12 may be formed before formation of the semiconductor layer.

For example, the third direction may be perpendicular to the first direction X and the second direction Y, that is, the third direction may be the longitudinal direction Z perpendicular to the substrate 11. Accordingly, the dummy separation structure 13 and the gate separation structure 14 may be perpendicular to the substrate 11.

In some specific embodiments, as shown in FIGS. 1-4, the three-dimensional memory may further comprise a dielectric layer 15 covering the step area 12B, and the dummy separation structure 13 penetrates through the dielectric layer 15 and the step area 12B in sequence in the longitudinal direction Z. For example, the material of the dielectric layer 15 may be an insulation material such as silicon oxide, etc. Moreover, during specific implementation, the material of the dummy separation structure 13 may be same as the material of the dielectric layer 15, for example, both of them are silicon oxide, so that the dummy separation structure 14 may not suffer from stress of the dielectric layer 15, thereby preventing lateral bending or twist deformation of the dummy separation structure 14.

In a specific embodiment, as shown in FIG. 1, the three-dimensional memory may further comprise at least one first sub-gate separation structure 18 and at least one second sub-gate separation structure 19. The at least one first sub-gate separation structure 18 is located in the block core areas K3/K4, extends to the first direction X, and is not connected with the second sub-gate separation structure 19. The at least one second sub-gate separation structure 19 is located in the block step areas K1/K2, extends to the first direction X, and is not connected with the first sub-gate separation structure 18. In the three-dimensional memory, the block core area K3 and the block step area K1 connected in the first direction X constitute a block memory area, the block core area K4 and the block step area K2 connected in the first direction X constitute another block memory area. Moreover, the purpose of disposing the first sub-gate separation structure 18 and the second sub-gate separation structure 19 in the block memory areas is to reduce the process difficulty. It is because the more the steps are, the higher the process difficulty is. To reduce the process difficulty, when there are a larger number of gates, the first sub-gate separation structure 18 and the second sub-gate separation structure 19 may be disposed to divide the block memory area into several portions, each of which exposes steps in respective layers. For example, when the number of the gate layers 121 is 32, if the block memory area is divided into four portions, then the first portion may expose 1st, 5th, 9th, 13th, 17th, 21st, 25th and 29th gate layers, the second portion may expose 2nd, 6th, 10th, 14th, 18th, 22nd, 26th and 30th gate layers, the third portion may expose 3rd, 7th, 11th, 15th, 19th, 23rd, 27th and 31st steps, and the fourth portion may expose 4th, 8th, 12th, 16th, 20th, 24th, 28th and 32nd steps, such that each portion only has eight steps, and at least one step comprises four gate layers 121. The process is simpler as compared with a solution of directly forming 32 consecutive steps. Moreover, the first sub-gate separation structure 18 and the second sub-gate separation structure 19 are staggered and not connected with each other, so that the gate layers 121 located on the same layer are electrically connected with each other. Moreover, the first sub-gate separation structure 18 and the second sub-gate separation structure 19 are approximately the same as the gate separation structure 14 in specific structure. Therefore, it is not described redundantly here.

Different from the related technology, in the three-dimensional memory in some embodiments of the present disclosure, the dummy separation structure and the gate separation structure are used to separate the step area and the core area of the gate stack structure respectively, the gate separation structure has the first end in contact with the dummy separation structure in the first direction, the dummy separation structure has the second end in contact with the gate separation structure in the first direction, and the first end is located within the second end, thereby avoiding the issue that the gate separation structure is susceptible to deformation or even rupture at the step area due to the stress effect of the step area when the gate separation structure is used to separate the step area, and thus improving the performance of the three-dimensional memory.

Referring to FIG. 7 and FIGS. 1-6, FIG. 7 is a flow chart of a manufacturing method of a three-dimensional memory provided by embodiments of the present disclosure, and FIGS. 1-6 are structural views of a three-dimensional memory or partial structures in the three-dimensional memory provided by embodiments of the present disclosure.

A specific procedure of the manufacturing method of the three-dimensional memory may be as follows:

Step S11: a gate stack structure 12 is formed, which comprises a core area 12A and a step area 12B which are disposed in juxtaposition and in direct contact in a first direction X.

For example, the gate stack structure 12 comprises a plurality of gate sacrificial layers and gate insulation layers 122 which are disposed in an alternate stack-up manner in a longitudinal direction Z perpendicular to the first direction X. The material of the gate sacrificial layers may be silicon nitride, the material of the gate insulation layers 122 may be silicon oxide, and the number of the gate sacrificial layers may depend on the number of memory cells to be formed in the longitudinal direction. During specific implementation, the gate stack structure 12 may be formed on a substrate 11 and is then etched, such that one of the ends of the gate stack structure 12 in the first direction X takes a step shape. For example, the material of the substrate 11 may be monocrystalline silicon, monocrystalline germanium, or silicon on insulator (SOI), etc.

Step S12: a dummy separation structure 13 and a gate separation structure 14 are formed, the dummy separation structure 13 penetrates through the step area 12B in the first direction X, the gate separation structure 14 penetrates through the core area 12A in the first direction X, the gate separation structure 14 has a first end 14A in contact with the dummy separation structure 13 in the first direction X, the dummy separation structure 13 has a second end 13A in contact with the gate separation structure 14 in the first direction X, and the first end 14A is located within the second end 13A.

For example, the dummy separation structure 13 can be used to divide the step area 12B of the gate stack structure 12 into a plurality of block step areas K1/K2 in a second direction Y perpendicular to the first direction X. The gate separation structure 14 can be used to divide the core area 12A of the gate stack structure 12 into a plurality of block core areas K3/K4 in the second direction Y.

For example, Step S12 may comprise:

Step S121: a dummy gate isolation trench 13 which penetrates through the step area 12B in the first direction X is formed in the step area 12B.

For example, before Step S121, it may further comprise: a dielectric layer 15 covering the step area 12B is formed, and the dummy gate isolation trench penetrates through the dielectric layer 15 and the step area 12B in sequence in the longitudinal direction Z. For example, the material of the dielectric layer 15 may be an insulation material such as silicon oxide, etc.

Step S122: an insulation material (e.g., silicon oxide, silicon nitride, silicon oxynitride or silicon carbonitride) is filled in the dummy gate isolation trench to obtain the dummy separation structure 13.

Step S123: a gate isolation trench is formed in the core area 12A and the second end 13A of the dummy separation structure 13, the gate isolation trench penetrates through the core area 12A and part of the second end 13A in the first direction X.

Step S124: the gate separation structure 14 is formed in the gate isolation trench.

For example, an electric insulation layer 141 (e.g., an oxidation layer) and a conductive structure 142 as a common source may be formed in sequence on sidewalls of the gate isolation trench to obtain the gate separation structure 14. For example, the conductive structure 142 may comprise a conductive material such as titanium or titanium nitride, polysilicon, and/or metal tungsten, etc.

In one embodiment, as shown in FIG. 5, the second end 13A may comprise two holding sub-parts 13A-1/13A-2 (i.e., a first holding sub-part 13A-1 and a second holding sub-part 13A-2), the first end 14A may be located between the first holding sub-part 13A-1 and the second holding sub-part 13A-2 in the second direction Y perpendicular to the first direction X and is in direct contact with the first holding sub-part 13A-1 and the second holding sub-part 13A-2.

For example, as shown in FIGS. 1 and 5, widths of the first holding sub-part 13A-1 and the second holding sub-part 13A-2 perpendicular to the second direction Y may gradually increase from the step area 12B to the core area 12A in the first direction X.

In a specific embodiment, as shown in FIG. 5, the second end 13A may further comprise a connection sub-part 13A-3 which is connected with the first holding sub-part 13A-1 and the second holding sub-part 13A-2. For example, the connection sub-part 13A-3 may be in direct contact with the first end 14A.

In one embodiment, as shown in FIG. 5, the dummy separation structure 13 may further comprise a second extending part 13B which is disposed in juxtaposition to and in direct contact with the second end 13A. The second extending part 13B may extend in the first direction X. Moreover, a width W1 of the second end 13A in the second direction Y perpendicular to the first direction X is greater than a width W2 of the second extending part 13B in the second direction Y.

For example, the width W1 of the second end 13A in the second direction Y may gradually increase from the step area 12B to the core area 12A in the first direction X. In some alternative embodiments, the width W1 of the second end 13A in the second direction Y may also first gradually increase and then gradually decrease from the step area 12B to the core area 12A in the first direction X.

In the above embodiments, the gate separation structure 14 may further comprise a first extending part 14B which is disposed in juxtaposition to and in direct contact with the first end 14A, and the first end 14A is surrounded by the first extending part 14B and the second end 13A of the dummy separation structure 13 together on the circumference. For example, the second extending part 13B may extend in the first direction X. Moreover, a width W3 of at least part of the first end 14A in the second direction Y perpendicular to the first direction X is greater than a width W4 of the first extending part 14B in the second direction Y.

For example, the width W3 of the first end 14A in the second direction Y may gradually increase from the core area 12A to the step area 12B in the first direction X. In some alternative embodiments, the width W3 of the first end 14A in the second direction Y may first gradually increase and then gradually decrease from the core area 12A to the step area 12B in the first direction X.

In some embodiments, the first end 14A may extend into the step area 12B in the first direction X.

In some embodiments, the maximum width of the first end 14A in the second direction Y perpendicular to the first direction X is not greater than the minimum width of the second end 13A in the second direction Y.

In some embodiments, the three-dimensional memory may further comprise a plurality of channel structures 16 located in the core area 12A, and a plurality of dummy channel structures 17 located in the step area 12B. For example, the plurality of channel structures 16 may penetrate through the core area 12A in a third direction (e.g., the longitudinal direction Z) intersected with the first direction X and the second direction Y. The plurality of dummy channel structures 17 may penetrate through the step area 12B in the third direction.

For example, the dummy separation structure 13 and the gate separation structure 14 may penetrate through the gate stack structure 12 in the third direction.

In some specific embodiments, the three-dimensional memory may further comprise a substrate 11 on which the gate stack structure 12 is located. For example, the third direction may be perpendicular to the first direction X and the second direction Y, that is, the third direction may be the longitudinal direction Z perpendicular to the substrate 11.

In some embodiments, before Step S124, it may further comprise:

Step S125: a gate line slit is formed in the core area 12A, the gate line slit is perpendicular to the substrate 11 and penetrates through the core area 12B in the first direction X.

For example, the gate line slit and the gate isolation trench may be formed by the same etching process, and the gate line slit is not connected with the dummy separation structure.

Step S126: the gate sacrificial layers in the gate stack structure 12 are replaced with gate layers 121 through the gate line slit and the gate isolation trench.

For example, the gate sacrificial layers in the gate stack structure 12 may be replaced by a replacement process, and a conductive material (e.g., tungsten) is filled in the same position to form the corresponding gate layers 121.

Step S127: a common source structure is formed in the gate line slit.

In specific embodiments, Step S127 and Step S124 may be carried out simultaneously, that is, an electric insulation layer 141 and a conductive structure 142 as a common source may be simultaneously formed on the gate line slit and sidewalls of the gate isolation trench in sequence to correspondingly obtain the common source structure and the gate separation structure 14.

It should be noted that, a specific structure of the three-dimensional memory in some embodiments of the present disclosure may be referred to specific implementations in the embodiments of the three-dimensional memory. Therefore, it is not described redundantly here.

Different from the related technology, the manufacturing method of the three-dimensional memory in some embodiments of the present disclosure comprises forming the gate stack structure comprising the core area and the step area which are disposed in juxtaposition and in direct contact in the first direction; and forming the dummy separation structure and the gate separation structure, the dummy separation structure penetrates through the step area in the first direction, the gate separation structure penetrates through the core area in the first direction, the gate separation structure has the first end in contact with the dummy separation structure in the first direction, the dummy separation structure has the second end in contact with the gate separation structure in the first direction, and the first end is located within the second end, thereby avoiding the issue that the gate separation structure is susceptible to deformation or even rupture at the step area due to the stress effect of the step area when the gate separation structure is used to separate the step area, and thus improving the performance of the three-dimensional memory.

The above mentioned are merely preferred embodiments of the present disclosure and are not used for limiting the present disclosure. Any modification, equivalent replacement, improvement and the like made within the spirits and principles of the present disclosure shall fall in the protection scope of the present disclosure.

What is claimed is:

1. A three-dimensional memory, comprising:
   a gate stack structure comprising a core area and a step area which are disposed in juxtaposition and in direct contact in a first direction;
   a dummy separation structure penetrating through the step area in the first direction; and
   a gate separation structure penetrating through the core area in the first direction, the gate separation structure having a first end in contact with the dummy separation structure in the first direction, the dummy separation structure having a second end in contact with the gate separation structure in the first direction, and the first end being located within the second end.

2. The three-dimensional memory of claim 1, wherein the second end comprises two holding sub-parts, the first end is located between the two holding sub-parts in a second direction perpendicular to the first direction and is in direct contact with the two holding sub-parts.

3. The three-dimensional memory of claim 2, wherein widths of the holding sub-parts in the second direction perpendicular to the first direction gradually increase from the step area towards the core area in the first direction.

4. The three-dimensional memory of claim 2, wherein the second end further comprises a connection sub-part which is connected with the two holding sub-parts.

5. The three-dimensional memory of claim 4, wherein the connection sub-part is in direct contact with the first end.

6. The three-dimensional memory of claim 1, wherein the dummy separation structure further comprises a second extending part which is disposed in juxtaposition to and in direct contact with the second end.

7. The three-dimensional memory of claim 6, wherein the second extending part extends in the first direction.

8. The three-dimensional memory of claim 6, wherein a width of the second end in a second direction perpendicular to the first direction is greater than a width of the second extending part in the second direction.

9. The three-dimensional memory of claim 8, wherein the width of the second end in the second direction gradually increases from the step area towards the core area in the first direction.

10. The three-dimensional memory of claim 8, wherein the width of the second end in the second direction first gradually increases and then gradually decreases from the step area towards the core area in the first direction.

11. The three-dimensional memory of claim 1, wherein a material of the dummy separation structure is an insulation material.

12. The three-dimensional memory of claim 1, wherein the gate separation structure further comprises a first extending part which is disposed in juxtaposition to and in direct contact with the first end, and the first end is surrounded by the first extending part and the second end together on the circumference.

13. The three-dimensional memory of claim 12, wherein the first extending part extends in the first direction.

14. The three-dimensional memory of claim 12, wherein a width of at least part of the first end in a second direction perpendicular to the first direction is greater than a width of the first extending part in the second direction.

15. The three-dimensional memory of claim 14, wherein a width of the first end in the second direction gradually increases from the core area towards the step area in the first direction.

16. The three-dimensional memory of claim 14, wherein a width of the first end in the second direction first gradually increases and then gradually decreases from the core area towards the step area in the first direction.

17. The three-dimensional memory of claim 1, wherein the first end extends into the step area in the first direction.

18. The three-dimensional memory of claim 1, wherein a maximum width of the first end in a second direction perpendicular to the first direction is not greater than a minimum width of the second end in the second direction.

19. The three-dimensional memory of claim 1, wherein the gate separation structure comprises a conductive structure and an electric insulation layer located between the conductive structure and the gate stack structure in the second direction perpendicular to the first direction.

20. The three-dimensional memory of claim 1, wherein the second end comprises two holding sub-parts, the first end is located between the two holding sub-parts in the second direction perpendicular to the first direction and is in direct contact with the two holding sub-parts, the three-dimensional memory further comprises:
   a plurality of channel structures located in the core area, the plurality of channel structures penetrating through the core area in a third direction intersected with the first direction and the second direction; and
   a plurality of dummy channel structures located in the step area, the plurality of dummy channel structures penetrating through the step area in the third direction.

* * * * *